(12) United States Patent
Hori et al.

(10) Patent No.: US 8,642,153 B2
(45) Date of Patent: Feb. 4, 2014

(54) SINGLE CRYSTAL SILICON CARBIDE SUBSTRATE AND METHOD OF MANUFACTURING THE SAME

(75) Inventors: Tsutomu Hori, Itami (JP); Makoto Sasaki, Itami (JP); Taro Nishiguchi, Itami (JP); Shinsuke Fujiwara, Itami (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 0 days.

(21) Appl. No.: 13/473,936

(22) Filed: May 17, 2012

(65) Prior Publication Data

US 2012/0315427 A1 Dec. 13, 2012

Related U.S. Application Data

(60) Provisional application No. 61/494,025, filed on Jun. 7, 2011.

(30) Foreign Application Priority Data

Jun. 7, 2011 (JP) ................................ 2011-126831

(51) Int. Cl.
*B32B 3/00* (2006.01)

(52) U.S. Cl.
USPC .......................................... 428/64.1; 423/345

(58) Field of Classification Search
USPC .......................................... 428/64.1; 423/345
See application file for complete search history.

(56) References Cited

U.S. PATENT DOCUMENTS

2010/0289033 A1* 11/2010 Ohtani et al. .................... 257/77

FOREIGN PATENT DOCUMENTS

JP 9-157091 6/1997

* cited by examiner

*Primary Examiner* — Elizabeth Mulvaney
(74) *Attorney, Agent, or Firm* — Drinker Biddle & Reath LLP

(57) ABSTRACT

A single crystal silicon carbide substrate has a 4H-polytype crystal structure, has with nitrogen atoms doped as a conduction impurity with an atomic concentration of more than $1 \times 10^{16}/cm^3$, and has a main surface containing a circle having a diameter of 5 cm. The single crystal silicon carbide substrate includes only one of a facet region and a non-facet region. Thus, variation in nitrogen atom concentration in the single crystal silicon carbide substrate can be suppressed.

5 Claims, 5 Drawing Sheets

SINGLE CRYSTAL SILICON CARBIDE SUBSTRATE AND METHOD OF MANUFACTURING THE SAME

This application claims the benefit of U.S. Provisional Application No. 61/494,025 filed Jun. 7, 2011, which is incorporated herein in the entirety.

BACKGROUND OF THE INVENTION

1. Field of the Invention

The present invention relates to a single crystal silicon carbide substrate and a method of manufacturing the same.

2. Description of the Background Art

A single crystal silicon carbide substrate has been employed in recent years as a substrate for use in manufacture of a semiconductor device. In particular, a single crystal silicon carbide substrate having a 4H polytype as a crystal structure is especially useful due to its high electron mobility. In order to obtain such substrate, methods of manufacturing an ingot made of single crystal silicon carbide having the 4H polytype have been under consideration.

According to a method disclosed in Japanese Patent Laying-Open No. 09-157091, for example, a source material made of silicon carbide is sublimated by heating, and supplied onto a seed crystal made of single crystal silicon carbide, to grow single crystal silicon carbide on this seed crystal. During this process, an impurity (nitrogen) is introduced with a concentration of $5 \times 10^{18}\,\mathrm{cm^{-3}}$ or more into carbon atom sites. According to this publication, the introduction of the impurity to substitute for the carbon atom sites allows a high-quality 4H-type single crystal silicon carbide to grow with high reproducibility.

During growth of a single crystal on a seed crystal, both spiral growth and step-flow growth take place. In the single crystal thus obtained, a facet region formed by the spiral growth and a non-facet region formed by the step-flow growth coexist. Accordingly, even if the facet region and the non-facet region are both of high quality, there is a significant difference in physical properties between them, resulting in wide variation in physical properties of the single crystal. As a result, in-plane variation in physical properties of a substrate cut from this single crystal increases as well. Specifically, nitrogen atom concentration tends to be high in the facet region and tends to be low in the non-facet region. Thus, in-plane variation in nitrogen atom concentration in the substrate increases.

SUMMARY OF THE INVENTION

The present invention was made in view of the above problems, and an object of the present invention is to provide a single crystal silicon carbide substrate capable of achieving suppressed variation in nitrogen atom concentration in the single crystal silicon carbide substrate, and a method of manufacturing the same.

A single crystal silicon carbide substrate of the present invention has a 4H-polytype crystal structure, has nitrogen atoms doped as a conduction impurity with an atomic concentration of more than $1 \times 10^{16}/\mathrm{cm^3}$, and has a main surface encompassing a circle having a diameter of 5 cm. The single crystal silicon carbide substrate includes only one of a facet region and a non-facet region.

According to the single crystal silicon carbide substrate of the present invention, the facet region where nitrogen atom concentration tends to be relatively high and the non-facet region where the nitrogen atom concentration tends to be relatively low do not coexist. Thus, variation in nitrogen atom concentration in the single crystal silicon carbide substrate can be suppressed. Specifically, a ratio of maximum value to minimum value of nitrogen atom concentration in the main surface can be set to less than 1.5.

Further, there is no boundary between the facet region and the non-facet region, where dislocation density tends to increase locally. Thus, variation in dislocation density in the single crystal silicon carbide substrate can be suppressed. Specifically, a ratio of maximum value to minimum value of dislocation density per unit area in the main surface can be set to less than 5.

Furthermore, the facet region that tends to have a small lattice constant due to the relatively high nitrogen atom concentration and the non-facet region that tends to have a large lattice constant due to the relatively low nitrogen atom concentration do not coexist. That is, there is no boundary between the facet region and the non-facet region having different lattice constants. Thus, warp of the single crystal silicon carbide substrate is readily suppressed.

Preferably, the single crystal silicon carbide substrate includes only the facet region. Thus, the single crystal silicon carbide substrate can be efficiently obtained from a silicon carbide single crystal obtained from a seed crystal having a small off angle relative to a {0001} plane.

Preferably, the main surface of the single crystal silicon carbide substrate has a circular shape. The shape of the main surface is thus highly symmetric, thereby further suppressing the warp of the single crystal silicon carbide substrate. The single crystal silicon carbide substrate having a circular shape includes a substrate having a notch or an orientation flat for identifying a crystal orientation.

A method of manufacturing a single crystal silicon carbide substrate of the present invention includes the following steps. A silicon carbide single crystal having a 4H-polytype single crystal structure, and doped with nitrogen atoms as a conduction impurity with an atomic concentration of more than $1 \times 10^{16}/\mathrm{cm^3}$ is prepared. The silicon carbide single crystal is ground to remove at least a part of the silicon carbide single crystal. After the step of grinding the silicon carbide single crystal, a silicon carbide substrate having a main surface encompassing a circle having a diameter of 5 cm and including only one of a facet region and a non-facet region is cut from the silicon carbide single crystal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
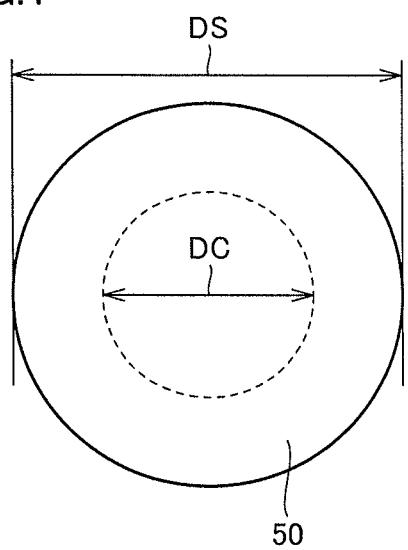
FIG. 1 is a plan view schematically illustrating a structure of a single crystal silicon carbide substrate in a first embodiment of the present invention.

Embodiments of the present invention will be described below with reference to the drawings. It is noted that the same or corresponding parts are designated by the same reference numerals in the following drawings, and description thereof will not be repeated. A group plane in terms of crystallography is indicated with { }.

(First Embodiment)

As shown in FIG. 1, a wafer (single crystal silicon carbide substrate) 50 in this embodiment has a main surface containing a circle having a diameter DC of 5 cm, preferably a main surface encompassing a circle having diameter DC of 10 cm. Preferably, the main surface of wafer 50 has a circular shape, and has diameter DS of more than 5 cm, preferably more than 10 cm.

Wafer 50 is made of single crystal silicon carbide. This single crystal has a hexagonal crystal structure, more specifically, a 4H-polytype crystal structure. Wafer 50 includes only one of a facet region and a non-facet region, preferably only a facet region. Preferably, a ratio of maximum value to minimum value of dislocation density per unit area in the main surface is set to less than 5. The dislocation density can be evaluated by counting the number of pits that appear as a result of etching of a wafer surface using molten alkali. Specifically, dislocations in the wafer appear as pits as a result of etching for five minutes in molten potassium hydroxide heated to 520° C. It is desirable to employ a unit area of 1 cm$^2$.

The facet region as used herein refers to a region formed by spiral growth, and the non-facet region refers to a region formed by step-flow growth.

Wafer 50 is an n type semiconductor substrate. Wafer 50 is doped with nitrogen atoms as a conduction impurity with an atomic concentration of more than $1 \times 10^{16}/cm^3$, to assume an n conductivity type. Preferably, a ratio of maximum value to minimum value of nitrogen atom concentration in the main surface is set to less than 1.5. The nitrogen atom concentration can be measured with SIMS (Secondary Ion Mass Spectroscopy) or the like.

A method of manufacturing wafer 50 will now be described.

Figure 2:
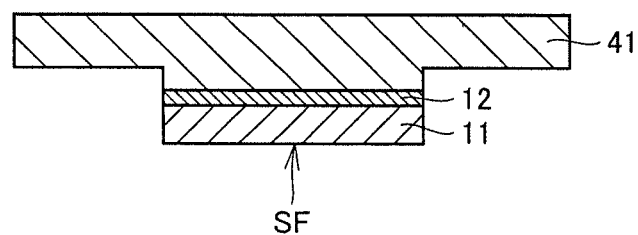
FIG. 2 is a cross sectional view schematically illustrating a first step of a method of manufacturing the single crystal silicon carbide substrate in the first embodiment of the present invention.

Referring to FIG. 2, a seed crystal 11 is prepared. Seed crystal 11 has a hexagonal crystal structure, more specifically, a 4H-polytype crystal structure. A plane orientation of a surface SF of seed crystal 11 may have an off angle relative to a {0001} plane. This off angle is preferably set to 1° or more and 8° or less, more preferably set to 1° or more and 3° or less, or 5° or more and 8° or less, and further preferably set to 1° or more and 3° or less. Seed crystal 11 has a thickness (vertical dimension in the figure) of 0.5 mm or more and 10 mm or less, for example. A plane of seed crystal 11 has a circular shape, for example, and has a diameter of more than 5 cm, preferably more than 10 cm.

A pedestal 41 having a mounting surface on which seed crystal 11 is to be mounted is prepared. This mounting surface includes a surface preferably made of carbon. Pedestal 41 is made of graphite, for example.

Next, the mounting surface of pedestal 41 and seed crystal 11 are bonded to each other with an adhesive 12.

Figure 3:
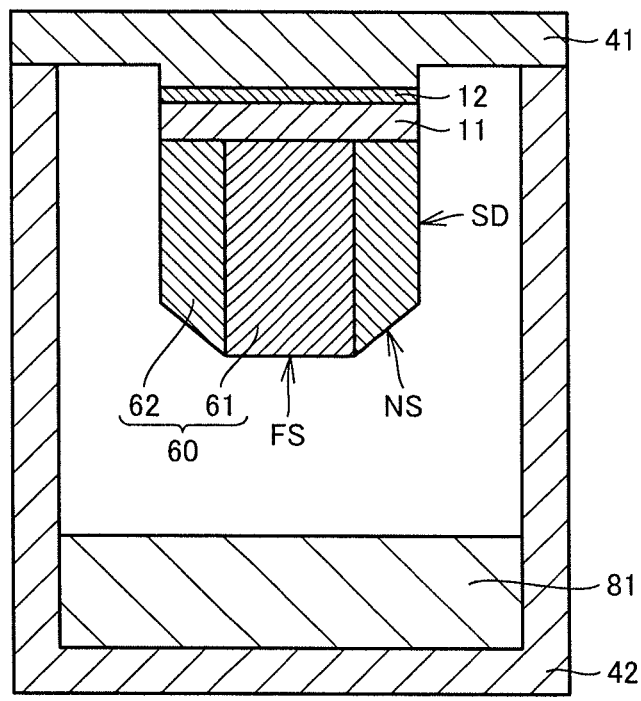
FIG. 3 is a cross sectional view schematically illustrating a second step of the method of manufacturing the single crystal silicon carbide substrate in the first embodiment of the present invention.

Referring to FIG. 3, a source material 81 formed of silicon carbide powders is placed in a crucible 42 made of graphite. Then, pedestal 41 is mounted such that seed crystal 11 faces the interior of crucible 42. Pedestal 41 may serve as a lid of crucible 42, as shown in FIG. 3.

Next, a single crystal 60 is grown on seed crystal 11 by a sublimation recrystallization method. That is, source material 81 is sublimated to deposit a sublimate on seed crystal 11. A temperature in the sublimation recrystallization method is set to 2100° C. or more and 2500° C. or less, for example. An atmospheric gas used in the sublimation recrystallization method is a gas containing nitrogen atoms, and specifically contains a nitrogen gas. The gas containing nitrogen atoms has a pressure set such that resulting single crystal 60 has a nitrogen atom concentration of more than $1 \times 10^{16}/cm^3$. The pressure of the atmospheric gas is preferably set to 1.3 kPa or more and atmospheric pressure or less, more preferably set to 13 kPa or less in order to enhance the growth rate.

Figure 4:
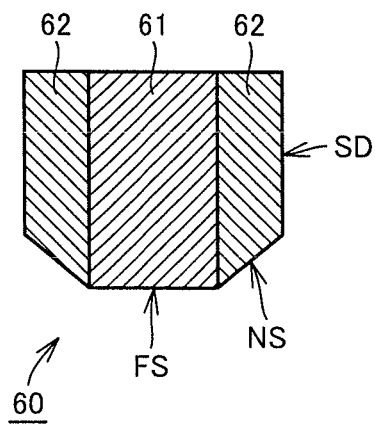
FIG. 4 is a cross sectional view along a line IV-IV in FIG. 5, schematically illustrating a third step of the method of manufacturing the single crystal silicon carbide substrate in the first embodiment of the present invention.
Figure 5:
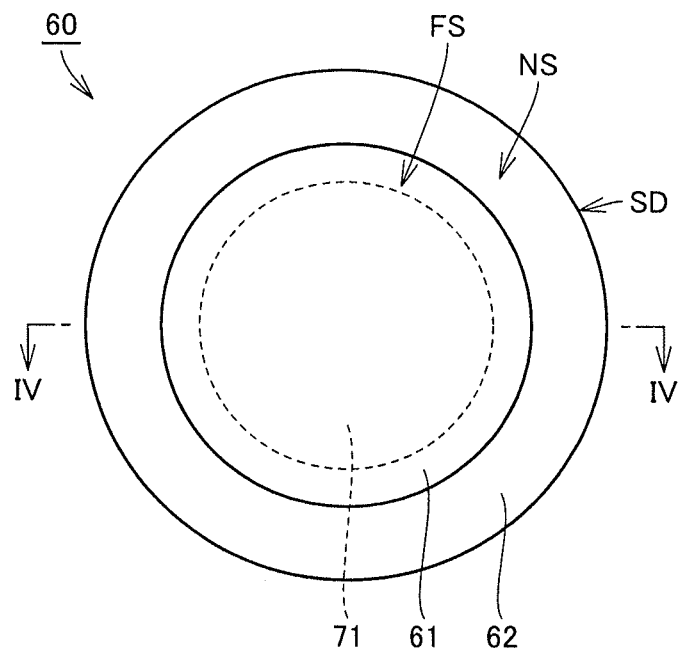
FIG. 5 is a plan view schematically illustrating the third step of the method of manufacturing the single crystal silicon carbide substrate in the first embodiment of the present invention.

Referring to FIGS. 4 and 5, single crystal 60 is removed from crucible 42. Single crystal 60 has a 4H-polytype single crystal structure. Single crystal 60 also has a facet region 61 and a non-facet region 62. In this embodiment, facet region 61 is near the center of single crystal 60, and non-facet region 62 is in an outer circumferential portion, when viewed two-dimensionally. Thus, a growth surface of single crystal 60 includes a spiral growth surface FS near the center, and a step-flow growth surface NS in the outer circumferential portion. In order for facet region 61 to be located near the center and for non-facet region 62 to be located in the outer circumferential portion in this manner, the plane orientation of surface SF of seed crystal 11 (FIG. 2) preferably has an off angle of 1° or more and 3° or less relative to the {0001} plane. Then, a side surface SD of single crystal 60 is subjected to grinding to remove non-facet region 62.

Figure 6:
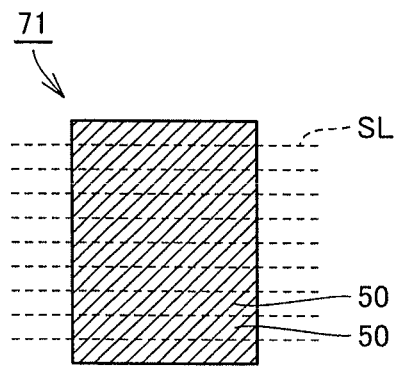
FIG. 6 is a cross sectional view schematically illustrating a fourth step of the method of manufacturing the single crystal silicon carbide substrate in the first embodiment of the present invention.

Referring to FIG. 6, a single crystal 71 including only the facet region is obtained as a result of the grinding. Then, wafers 50 are cut from single crystal 71 as indicated with broken lines SL. Wafers 50 are thus obtained.

According to wafer 50 in this embodiment, facet region 61 where the nitrogen atom concentration tends to be relatively high and non-facet region 62 where the nitrogen atom concentration tends to be relatively low do not coexist. Thus, variation in nitrogen atom concentration in wafer 50 can be suppressed. Specifically, the ratio of maximum value to minimum value of nitrogen atom concentration in the main surface can be set to less than 1.5. According to the findings by the present inventors, when the nitrogen atom concentration is more than $1 \times 10^{16}/cm^3$, the nitrogen atom concentration in facet region 61 is equal to or more than twice the nitrogen atom concentration in non-facet region 62, and thus as long as facet region 61 and non-facet region 62 coexist, it was difficult to set the ratio of maximum value to minimum value of nitrogen atom concentration in the main surface of wafer 50 to less than 1.5.

Further, there is no boundary between facet region 61 and non-facet region 62, where the dislocation density tends to increase locally. Thus, variation in dislocation density in wafer 50 can be suppressed. Specifically, the ratio of maximum value to minimum value of dislocation density per unit area in the main surface can be set to less than 5. According to the findings by the present inventors, since the dislocation density significantly increases locally at the boundary between facet region 61 and non-facet region 62, as long as facet region 61 and non-facet region 62 coexist, it was difficult to set the ratio of maximum value to minimum value of dislocation density per unit area in the main surface of wafer 50 to less than 5.

Furthermore, facet region 61 that tends to have a small lattice constant due to the relatively high nitrogen atom concentration and non-facet region 62 that tends to have a large lattice constant due to the relatively low nitrogen atom concentration do not coexist. That is, there is no boundary between facet region 61 and non-facet region 62 having different lattice constants. Thus, warp of wafer 50 can be suppressed.

Wafer 50 includes only facet region 61. Such wafer 50 is readily formed from a single crystal mainly including a facet region, particularly from single crystal 71 including only the facet region (FIG. 6). Such single crystal is readily obtained from single crystal 60 including facet region 61 neat the center (FIGS. 4 and 5). Such single crystal 60 is readily obtained from seed crystal 11 having an off angle of 1° or more and 3° or less relative to the {0001} plane. Since seed crystal 11 having such a relatively small off angle can be selected, single crystal 60 can be grown efficiently.

Preferably, the main surface of wafer 50 has a circular shape. The shape of the main surface is thus highly symmetric, thereby further suppressing the warp of wafer 50.

Although wafer 50 is cut from single crystal 71 including only facet region 61 in this embodiment, the wafer may be cut from a single crystal partially including non-facet region 62, as long as ultimate wafer 50 includes only the facet region.

(Second Embodiment)

Unlike wafer 50 in the first embodiment (FIG. 1), a wafer in this embodiment includes only a non-facet region. The wafer is otherwise similar to wafer 50.

Figure 7:
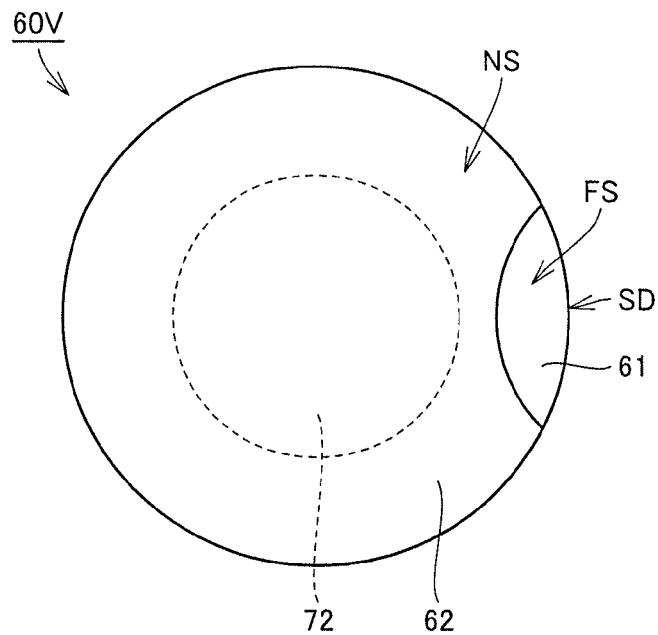
FIG. 7 is a cross sectional view schematically illustrating a step of a method of manufacturing a single crystal silicon carbide substrate in a second embodiment of the present invention.

Referring to FIG. 7, in order to obtain such wafer, it is preferable to prepare a single crystal 60V having facet region 61 shifted to an outer circumferential portion when viewed two-dimensionally. Single crystal 60V can be grown using a seed crystal having a relatively large off angle relative to the {0001} plane. Specifically, the off angle is set to 5° or more and 8° or less, for example.

As described above, single crystal 60V has facet region 61 shifted to the outer circumferential portion. Accordingly, a single crystal 72 including only non-facet region 62 can be obtained from single crystal 60V with a smaller amount of grinding. Consequently, a wafer including only non-facet region 62 can be cut from single crystal 72.

Although the wafer is cut from single crystal 72 including only non-facet region 62 in this embodiment, the wafer may be cut from a single crystal partially including facet region 61, as long as the ultimate wafer includes only non-facet region 62.

(Third Embodiment)

Figure 8:
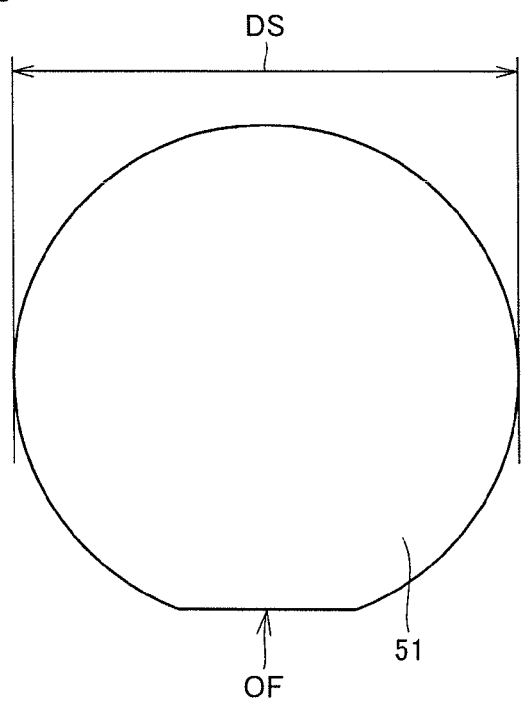
FIG. 8 is a plan view schematically illustrating a structure of a single crystal silicon carbide substrate in a third embodiment of the present invention.

Referring to FIG. 8, a wafer 51 in this embodiment is provided with an orientation flat OF. Orientation flat OF is formed by removing a part of wafer 51 for the purpose of identifying the orientation of wafer 51. Since the presence of orientation flat OF has an influence only on a part of an outer circumferential region of wafer 51, orientation flat OF is ignored when determining whether or not wafer 51 has a main surface encompassing a circle having a specific diameter. That is, in FIG. 8, the main surface of wafer 51 is regarded as a circular shape having diameter DS. The structure of wafer 51 is otherwise substantially identical to those of the wafers in the first and second embodiments described above. Therefore, the same or corresponding elements are designated by the same reference numerals, and description thereof will not be repeated.

Figure 9:
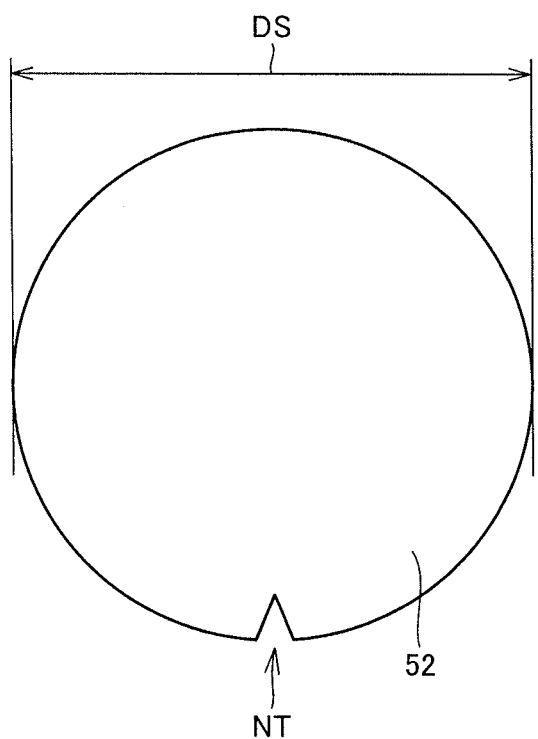
FIG. 9 is a plan view schematically illustrating a modification of FIG. 8.

Referring to FIG. 9, a wafer 52 which is a modification of wafer 51 has a notch NT instead of orientation flat OF. Notch NT is formed by removing a part of wafer 52 for the purpose of identifying the orientation of wafer 52. Since the presence of notch NT has an influence only on a part of an outer circumferential region of wafer 52, notch NT is ignored when determining whether or not wafer 52 has a main surface encompassing a circle having a specific diameter. That is, in FIG. 9, the main surface of wafer 52 is regarded as a circular shape having diameter DS.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A single crystal silicon carbide substrate having a 4H-polytype crystal structure, and having a main surface encompassing a circle having a diameter of 5 cm, comprising
    nitrogen atoms doped as a conduction impurity with an atomic concentration of more than $1 \times 10^{16}/\text{cm}^3$,
    said single crystal silicon carbide substrate including only one of a facet region and a non-facet region, wherein
    a ratio of maximum value to minimum value of said atomic concentration in said main surface is set to less than 1.5.

2. The single crystal silicon carbide substrate according to claim 1, wherein
    a ratio of maximum value to minimum value of dislocation density per unit area in said main surface is set to less than 5.

3. The single crystal silicon carbide substrate according to claim 1, including only the facet region.

4. The single crystal silicon carbide substrate according to claim 1, wherein
    said main surface has a circular shape.

5. A method of manufacturing a single crystal silicon carbide substrate, comprising the steps of:
    preparing a silicon carbide single crystal having a 4H-polytype single crystal structure, including a facet region and a non-facet region, and doped with nitrogen atoms as a conduction impurity with an atomic concentration of more than $1 \times 10^{16}/\text{cm}^3$;
    grinding said silicon carbide single crystal to remove one of said facet region and said non-facet region of said silicon carbide single crystal; and
    after said step of grinding said silicon carbide single crystal, cutting a silicon carbide substrate from said silicon carbide single crystal, said silicon carbide substrate having a main surface encompassing a circle having a diameter of 5 cm, and said silicon carbide substrate including only one of said facet region and said non-facet region.

\* \* \* \* \*